(12) United States Patent
Raisanen

(10) Patent No.: US 12,292,122 B2
(45) Date of Patent: May 6, 2025

(54) BYPASS STRAINER VALVE ASSEMBLY AND METHOD

(71) Applicant: Hoffmann Enclosures Inc., Anoka, MN (US)

(72) Inventor: Richard Raisanen, Coon Rapids, MN (US)

(73) Assignee: Hoffman Enclosures Inc., Anoka, MN (US)

( * ) Notice: Subject to any disclaimer, the term of this patent is extended or adjusted under 35 U.S.C. 154(b) by 449 days.

(21) Appl. No.: 17/769,941

(22) PCT Filed: Oct. 16, 2020

(86) PCT No.: PCT/US2020/055951
§ 371 (c)(1),
(2) Date: Apr. 18, 2022

(87) PCT Pub. No.: WO2021/076870
PCT Pub. Date: Apr. 22, 2021

(65) Prior Publication Data
US 2022/0381355 A1 Dec. 1, 2022

Related U.S. Application Data

(60) Provisional application No. 62/915,951, filed on Oct. 16, 2019.

(51) Int. Cl.
*F16K 11/22* (2006.01)
*B01D 29/35* (2006.01)
(Continued)

(52) U.S. Cl.
CPC .............. *F16K 11/22* (2013.01); *B01D 29/35* (2013.01); *B01D 29/96* (2013.01); *B01D 35/147* (2013.01);
(Continued)

(58) Field of Classification Search
CPC ........ F16K 11/22; F16K 31/14; F16K 11/044; F16K 11/052; F16K 31/12;
(Continued)

(56) References Cited

U.S. PATENT DOCUMENTS 1,657,173 A  1/1928  Morrison
3,306,451 A  2/1967  Kudlaty
(Continued)

FOREIGN PATENT DOCUMENTS

CN  204933031 U  1/2016
DE  29521755 U1  10/1998
(Continued)

OTHER PUBLICATIONS

"Installation, Operation, and Maintenance" (Keckley) Mar. 26, 2018, [retrieved online] ,URL: https://www.keckley,com/assets/files/2-1_y-strainers/Y-Strainer%20OM%20Rev%20A%20(03-26-18).pdf>.
(Continued)

*Primary Examiner* — Waqaas Ali
(74) *Attorney, Agent, or Firm* — Quarles & Brady LLP

(57) ABSTRACT

A bypass strainer valve assembly can be used for controlling the flow of a fluid. The bypass strainer valve assembly can have a valve body with a valve body inlet, a valve body outlet, and a filter chamber. A first valve element can be moveable within the valve body between a first position and a second position, and a second valve element can be moveable within the valve body between a first position and a second position. The first valve element in the first position and the second valve element in the first position can be configured to cooperatively direct fluid through the filter chamber, as the fluid flows from the valve body inlet to the valve body outlet.

20 Claims, 4 Drawing Sheets

(51) Int. Cl.
  *B01D 29/96* (2006.01)
  *B01D 35/147* (2006.01)
  *F16K 31/14* (2006.01)
  *H05K 7/20* (2006.01)

(52) U.S. Cl.
  CPC ......... *F16K 31/14* (2013.01); *H05K 7/20763* (2013.01); *B01D 2201/306* (2013.01)

(58) Field of Classification Search
  CPC ..... F16K 11/0873; B01D 29/35; B01D 29/96; B01D 35/147; B01D 2201/306; H05K 7/20763
  See application file for complete search history.

(56) References Cited

U.S. PATENT DOCUMENTS

| | | | |
|---|---|---|---|
| 3,363,762 A | | 1/1968 | Ensign |
| 3,823,831 A | * | 7/1974 | LeBlanc, Jr. .......... B01D 35/02 210/429 |
| 4,379,053 A | | 4/1983 | Brane |
| 6,162,354 A | | 12/2000 | Yang et al. |
| 9,345,994 B2 | | 5/2016 | Morris |
| 9,631,641 B2 | | 4/2017 | Choi |
| 2014/0261848 A1 | | 9/2014 | Roden |

FOREIGN PATENT DOCUMENTS

| | | |
|---|---|---|
| EP | 1748234 A1 | 1/2007 |
| JP | 2000-117017 A | 4/2000 |
| JP | 3139226 B2 | 2/2001 |
| JP | 3341189 B2 | 11/2002 |
| JP | 2006-082031 A | 3/2006 |
| JP | 2012-075968 A | 4/2012 |
| JP | 2012-225395 A | 11/2012 |
| KR | 10-2012-0003052 A | 1/2012 |
| KR | 10-1113786 B1 | 2/2012 |
| KR | 10-1573682 B1 | 12/2015 |
| KR | 10-2017-0096918 A | 8/2017 |
| WO | 96/04062 A1 | 2/1996 |
| WO | 00/71897 A1 | 11/2000 |

OTHER PUBLICATIONS

A. Sloley, "Reliability and Maintenance: Don't Slight Strainers", Chemical Processing, May 8, 2014.
ASHRAE Technical Committee 9.9, "Water-Cooled Servers Common Designs, Components, and Processes", Oct. 10, 2019, 50 pages.
Machine translation of DE 295 21 755 U1.

* cited by examiner

BYPASS STRAINER VALVE ASSEMBLY AND METHOD

CROSS-REFERENCE TO RELATED APPLICATIONS

This application is the national stage entry of PCT International Application No. PCT/US2020/055951, filed Oct. 16, 2020, which claims the benefit of U.S. Provisional Patent Application No. 62/915,951, filed Oct. 16, 2019, the entireties of both of which are incorporated herein by reference for all purposes.

BACKGROUND

In many liquid cooling systems, it may be useful to capture contaminates within the fluid coolant with an inline filter. For example, in a liquid cooling system for a server rack, debris from building water or other particles may need to be filtered from one or more pump-driven flow loops.

SUMMARY

Some embodiments of the invention provide a bypass strainer valve assembly for controlling the flow of a fluid. The bypass strainer valve assembly can include a valve body with a valve body inlet, a valve body outlet, and a filter chamber. A first valve element can be moveable within the valve body between a first position and a second position, and a second valve element can be moveable within the valve body between a first position and a second position. The first valve element in the first position and the second valve element in the first position can be configured to cooperatively direct fluid through the filter chamber, as the fluid flows from the valve body inlet to the valve body outlet.

Other embodiments of the invention provide a liquid cooling system for cooling components housed within a server rack. The liquid cooling system including a piping system and a pump for moving a liquid through the piping system. The liquid cooling system can further include a bypass strainer valve assembly having a valve body with a valve body inlet coupled to the piping system, a valve body outlet coupled to the piping system, a filter chamber, and a bypass chamber. The liquid cooling system can also have a first valve element that can be movable between a first position and a second position, a second valve element that can be movable between a first position and a second position, and a filter that can be configured to be received within the filter chamber. The first valve element in the first position and the second valve element in the first position can be configured to cooperatively direct fluid through the filter in the filter chamber, as the fluid flows from the valve body inlet to the valve body outlet. The first valve element in the second position and the second valve element in the second position can be configured to direct fluid through the bypass chamber and block flow of the fluid into the filter chamber, as the fluid flows from the valve body inlet to the valve body outlet.

Other embodiments of the invention provide a method for servicing a filter in a high density liquid cooling system with coolant fluid and a valve assembly that includes a valve body. The method can include adjusting a first valve element in the valve body to cause the first valve element and a second valve element to move, to cause flow through the valve body to bypass a filter chamber; removing an access cap from the valve body to access the filter chamber; affixing the access cap to the valve body; and adjusting the first valve element to cause the first and second valve elements to move, to direct the flow through the valve body through the filter chamber.

Some embodiments of the invention provide a bypass strainer valve assembly for controlling the flow of a fluid. The bypass strainer valve assembly can include a valve body with a valve body inlet, a valve body outlet, and a filter chamber. A first valve element can be moveable within the valve body between a first position and a second position. The first valve element can be a ball valve. A second valve element can be moveable within the valve body between a first position and a second position. The second valve element can be a flapper valve. With the first valve element in the first position and the second valve element in the first position, the first and second valve elements can be configured to cooperatively direct fluid through the filter chamber, as the fluid flows from the valve body inlet to the valve body outlet. The second valve element can be configured to be moved into the first position or the second position by force exerted by the flow of fluid through the valve body when the first valve element is in the first position or the second position, respectively.

In some embodiments, the valve body can further include a bypass chamber. Wherein with the first valve element in the second position and the second valve element in the second position, the first and second valve elements can be configured to cooperatively direct fluid through the bypass chamber, as the fluid flows from the valve body inlet to the valve body outlet.

In some embodiments, the second valve element can be configured to prevent fluid from flowing into the bypass chamber when in the first position and prevent fluid from flowing into the filter chamber when in the second position.

In some embodiments, a filter can be provided and can be configured to be received within the filter chamber, wherein fluid can pass through the filter when the first valve element is in the first position.

In some embodiments, the an access cap can be provided and can be configured to retain the filter within the filter chamber and allow access thereto.

In some embodiments, a handle can be operatively coupled to the first valve element and can be configured to move the first valve element between the first position and the second position.

In some embodiments, the first valve element can be further movable to a third position. When the first valve element is in the third position, fluid can be prevented from flowing through the valve body.

In some embodiments, the first valve element can be a three-way ball valve.

Other embodiments of the invention provide a liquid cooling system for cooling components housed within a server rack. The liquid cooling system can include a piping system and a pump for moving a liquid through the piping system. The liquid cooling system can further include a bypass strainer valve assembly. The bypass strainer valve assembly can include a valve body with a valve body inlet that can be configured to be coupled to the piping system, a valve body outlet that can be coupled to the piping system, a filter chamber, and a bypass chamber. A first valve element can be provided within the valve body and can be movable between a first position and a second position. A second valve element can be provided within the valve body and can be movable between a first position and a second position. A filter can be removably received within the filter chamber. With the first valve element in the first position and the second valve element in the first position, the first and second valve elements can be configured to cooperatively direct fluid through the filter in the filter chamber, as the fluid flows from the valve body inlet to the valve body outlet. With the first valve element in the second position and the second valve element in the second position, the first and second valve elements can be configured to cooperatively direct fluid through the bypass chamber and block flow of the fluid into the filter chamber, as the fluid flows from the valve body inlet to the valve body outlet.

In some embodiments, the liquid cooling system can further include a removable access cap configured to retain the filter within the filter chamber and allow access thereto. When the first valve element is in the first position and the second valve element is in the first position, the filter can be accessed and removed from the filter chamber by removing the access cap and accessing the filter without interrupting the flow of the fluid through the bypass strainer valve.

In some embodiments, the first valve element can be configured to be manually movable between the first and second positions from outside of the valve body. The second valve element can be configured to be moved between the first and second positions by fluid flow that is directed by the first valve element.

In some embodiments, the first valve element of the bypass strainer valve assembly can be further movable to a third position. When the first valve element is in the third position, the fluid can be prevented from flowing through the valve body.

In some embodiments, the first valve element of the bypass strainer valve assembly can be a three-way ball valve.

In some embodiments, the second valve element of the bypass strainer valve assembly can move between the first and second positions by force exerted by the fluid moving through the valve body.

In some embodiments, the second valve element of the bypass strainer valve assembly can be a check valve.

In some embodiments, the second valve element of the bypass strainer valve assembly can be a flapper valve.

In some embodiments, the first valve element and the second valve element can be configured to move independently of each other.

Other embodiments of the invention provide a method for servicing a filter in a high density liquid cooling system with coolant fluid and a valve assembly that includes a valve body. The method can include adjusting a first valve element in the valve body to cause the first valve element and a second valve element to separately move, to cooperatively cause flow through the valve body to bypass a filter chamber. While the flow bypasses the filter chamber, the access cap can be removed from the valve body to access the filter chamber. After accessing the filter chamber, the access cap can be affixed to the valve body. After affixing the access cap to the valve body, the first valve element can be adjusted to cause the first and second valve elements to move, to direct the flow through the valve body through the filter chamber.

In some embodiments, the second valve element can move due to the force of the flow from the adjustment of the first valve altering the flow bath through the valve body.

In some embodiments, after removing the access cap, a first filter can be removed from within the filter chamber and a second filter can be placed within the filter chamber.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Figure 1:
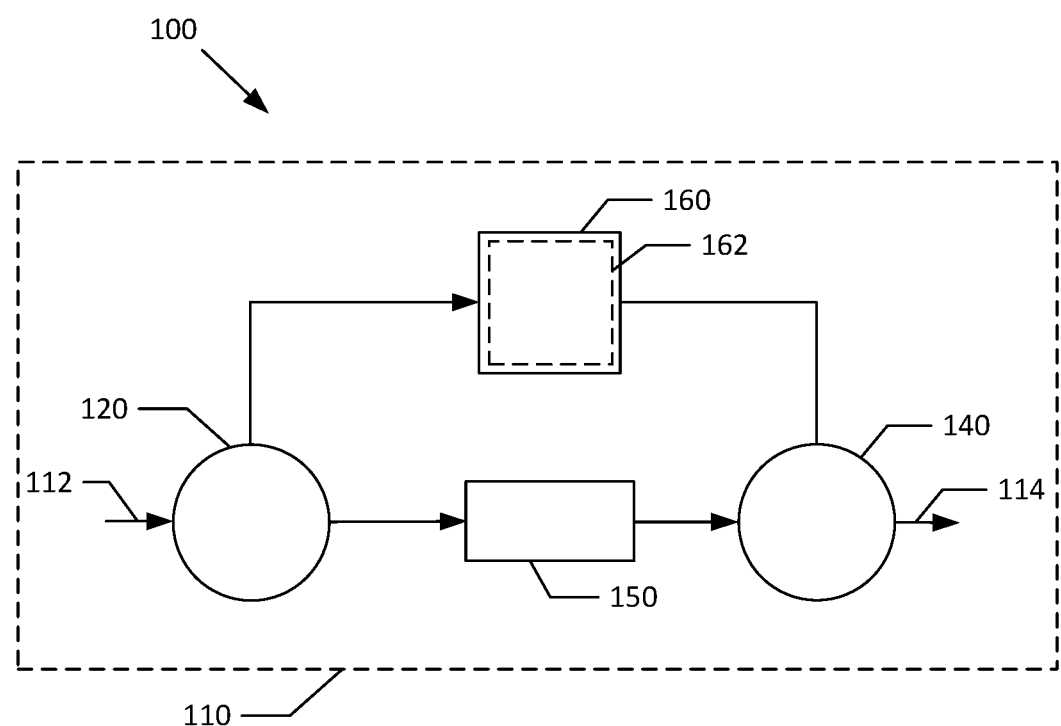
FIG. 1 is a schematic view of a bypass strainer valve assembly according to embodiments of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Some of the discussion below describes a valve assembly that includes a filter that can be incorporated into a liquid cooling system in or for a server rack. The valve assembly can be adjusted (e.g., manually) to bypass the filter during inspection/replacement of the filter or at other times, while allowing a fluid coolant to continue to circulate through the liquid cooling system. The context and particulars of this discussion are presented as examples only. For example, embodiments of the disclosed invention can be configured in various ways, including with other shapes and arrangements of elements. Similarly, embodiments of the invention can be used with arrangements of other cooling systems or with fluid distribution systems other than those expressly illustrated or described herein.

Generally, in filtered liquid cooling system systems, the filter needs to be periodically serviced or replaced. However, in conventional arrangements, the flow of the fluid coolant through the system must be stopped or re-routed to do so. Stopping the fluid coolant can increase the heat present throughout the system because the heat is not being removed by the fluid coolant, and additional heat can significantly reduce the performance of the servers in the server rack. Although plumbed bypass loops are used in some conventional systems, this can take up a large amount of space, which may increase costs and decrease effectiveness for server-rack and other systems.

Embodiments of the invention can address these or other issues, including by providing a filtering assembly that includes a selectively operable bypass but exhibits a relatively small footprint. For example, in some embodiments of the invention, a valve assembly can include a valve body with a bypass chamber and a filter chamber, both of which are arranged to provide a flow path between an inlet and an outlet of the valve body. The valve body can also include one or more valve elements that can be adjusted to selectively route flow only through the bypass chamber or only through the filter chamber. Thus, flow of fluid coolant between the inlet and the outlet can be selectively directed to flow through a filter housed in the filter chamber, or bypass the filter by flowing through the bypass chamber. Usefully, this arrangement can allow access to the filter without requiring operators to stop the flow of fluid coolant through the liquid cooling system. Thus, by selectively routing flow to bypass a filter, some valve assemblies according to the invention can substantially reduce the time that fluid coolant is stopped from flowing through the liquid cooling system during inspection, replacement, or other servicing of the filter. Additionally, valve assemblies according to the invention can reduce the amount of space required within the liquid cooling system as compared to conventional systems.

In some embodiments, two valve elements can be provided, each configured to control (e.g., direct) flow at a different location within the larger filtering assembly. For example, one valve element can be configured to control flow at an upstream location within the filtering assembly and another valve element can be configured to control flow at a downstream location within the filtering assembly. In some cases, only a subset (e.g., only one) of multiple valve elements may be actively operable, such as by manual engagement, whereas other (e.g., another one) of the multiple valve elements may operate automatically based on a state or change in state (e.g., based on manual operation) of the actively operable valve element(s). For example, a first valve element may be operable by a user or other input source external to the filtering assembly and a second valve element may automatically operate due to the routing (or rerouting) of flow by the first valve element. In such cases, for example, the benefit of multiple valve elements and multiple selectively operable control points for flow within a filtering assembly can be obtained without requiring sealing arrangements for every one of the valve elements.

FIG. 1 illustrates a schematic diagram of an example bypass strainer valve assembly 100. In some installations, the bypass strainer valve assembly 100 can be included as part of a larger liquid cooling system for a server rack (not shown). For example, such a liquid cooling system can include a piping system in thermal communication with servers, and a pump to distribute coolant fluid through the piping system. The coolant fluid can thus remove heat produced by the servers, to allow the servers to run more optimally.

The bypass strainer valve assembly 100 can include a valve body 110 with an inlet 112 and an outlet 114. The valve body 110 can also encompass (e.g., sealingly encloses) a first valve element 120, a second valve element 140, a bypass chamber 150, a filter chamber 160, and a filter 162 (e.g., a removable filter). As further discussed relative to some examples below, the first and second valve elements 120, 140 can be generally configured to move within the valve body 110 to selectively route flow from the inlet 112 to the outlet 114 via the bypass chamber 150, or the filter chamber 160 and the filter 162.

It is contemplated that, in different embodiments, differently configured valve elements can be used. For example, the first valve element 120 can be operated to selectively direct flow from the inlet 112 through the bypass chamber 150 or the filter chamber 160 depending on a state of the first valve element 120. In some embodiments, the first valve element 120 can also prevent flow through valve body 110 (e.g., when placed in a third state not corresponding to flow through the bypass chamber 150 or the filter chamber 160). For example the first valve element 120 can be a ball valve or a diverter valve. In some embodiments, the first valve element 120 can be manually or otherwise operable from outside of the valve body 110.

In some embodiments, the second valve element 140 can be passively operated (e.g., can operate based on a state of flow or of another valve element, rather than based on direct input from outside of the valve body 110). For example, the second valve element 140 can be a check (e.g., flapper) valve element that is freely movable between positions depending on the flow direction through the valve body 110. Thus, for example, the second valve element 140 can operate to allow flow from either of the chambers 150, 160 to the outlet 114 but prevent flow from one of the chambers 150, 160 to the other of the chambers 160, 150.

In some embodiments, the second valve element 140 can be manually operated. For example, the second valve element 140 can be a ball valve, a diverter valve, or a manually operated flapper valve. In some embodiments, the second valve element 140 can be operatively coupled to the first valve element 120, wherein movement of the first valve element 120 also moves the second valve element 140 (e.g., mechanically, electrically, or magnetically), rather than via control of the state of flow within the strainer valve assembly 100. Therefore, according to an embodiment of the invention, the first valve element 120 can be a diverter valve and the second valve element 140 can also be a diverter valve. In another embodiment, the first valve element 120 can be a diverter valve and the second valve element can be a ball valve. It should be understood that these are examples and that the bypass strainer valve assembly 100 can have first and second valve elements 120, 140 of similar or different types of valves.

Figure 2:
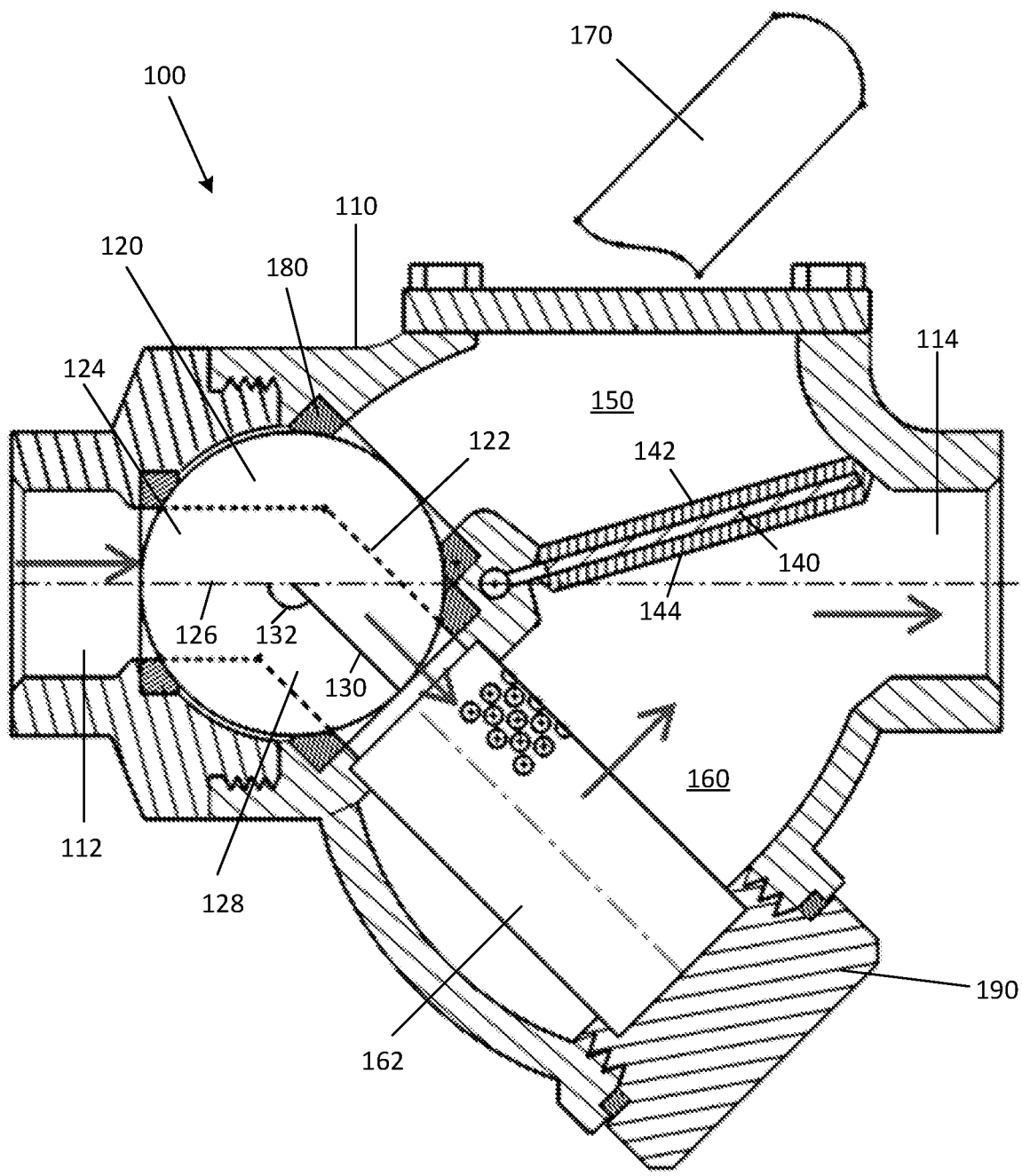
FIG. 2 is a cross-sectional view of a bypass strainer valve assembly in a first state according to an embodiment of the invention.
Figure 3:
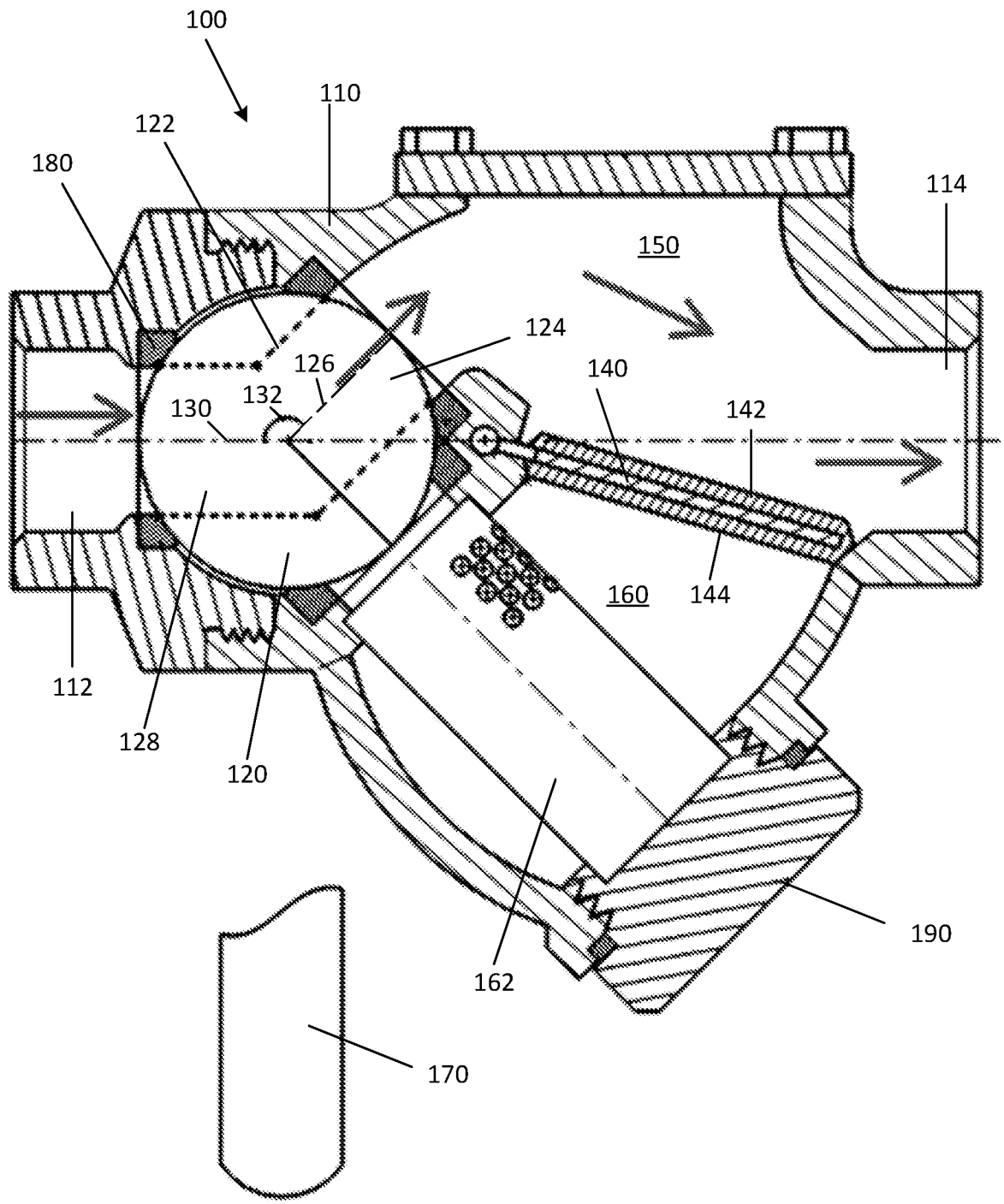
FIG. 3 is a cross-sectional view of the bypass strainer valve assembly of FIG. 2 in a second state.

FIGS. 2 and 3 illustrate an example configuration of the bypass strainer valve assembly 100 in which the first valve element 120 is a three-way ball valve and the second valve element 140 is a flapper valve element. FIG. 2 illustrates the bypass strainer valve assembly 100 in a first state with flow directed through the filter chamber 160 and FIG. 3 illustrates the bypass strainer valve assembly 100 in a second state with flow directed through the bypass chamber 150.

The first valve element 120 has a passageway 122 that is movable between a first position (FIG. 2) and a second position (FIG. 3). The passageway 122 has a first passage portion 124 extending along a first axis 126 that merges with a second passage portion 128 extending along a second axis 130. In some embodiments, axes through a valve can be preferably offset from each other. For example, an angle 132 between the first and second axes 126, 130 is approximately 135 degrees. Seat rings 180 are also provided, to seal the first valve 120 within the valve body 110.

Continuing relative to the example configuration of the assembly 100, the second valve element 140 is movable between a first position (FIG. 2) and a second position (FIG. 3). The second valve element 140 is positioned to define part of a fluid flow path between the filter chamber 160 and the outlet 114 when in the first position, and part of a fluid flow path between the bypass chamber 150 and the outlet 114 when in the second position.

Generally, at least one valve element within a valve body according to the invention can be moved due to an external input (e.g., manual or automated inputs). In some embodiments, a first valve element may be manually (or otherwise) movable and a second valve element may move automatically, for example due to fluid force, upon movement of the first valve element. For example, in the assembly 100, a handle 170 is coupled to the first valve element 120. The handle 170 can be actuated manually to operate the first valve element 120, including to move the first valve element 120 between the first position (FIG. 2) and the second position (FIG. 3). In contrast, no external actuator is provided for the second valve element 140, which is generally moved between the first and second positions by flow through the valve body 110, depending on the current position of the first valve element 120.

In the first state of the bypass strainer valve assembly 100, as shown in FIG. 2, coolant fluid flow is directed through the filter 162. The first valve element 120 is in the first position with the first passage portion 124 adjacent and in fluid communication with the inlet 112 and the second passage portion 128 adjacent and in fluid communication with the filter 162 and the filter chamber 160. Further, a body of the valve element 120 seals against flow into the upstream entrance to the bypass chamber 150. Thus, as shown with flow arrows, coolant fluid first enters the valve body 110 through the inlet 112. The coolant fluid then flows through the first passage portion 124 and then the second passage portion 128 of the first valve element 120, through the filter chamber 160, past the second valve element 140, and out of the bypass strainer valve assembly 100 through the outlet 114. In the illustrated embodiment, the second valve element 140 is moved into the first position automatically: the force of the fluid flowing through the valve body 110 and impinging on a first side 144 of the second valve element 140, as directed by the first valve element 120, forces the valve element 140 to open the path between the filter chamber 160 and the outlet 114 and to close the path between the bypass chamber 150 and the outlet 114.

In the second state of the bypass strainer valve assembly 100 shown in FIG. 3, coolant fluid flow is directed through the bypass chamber 150. The first valve element 120 is in the second position with the first passage portion 124 adjacent and in fluid communication with the bypass chamber 150 and the second passage portion 128 adjacent and in fluid communication with the inlet 112. Further, a body of the valve element 120 seals against flow into the upstream entrance to the filter chamber 160. Thus, as shown with flow arrows, coolant fluid first enters through the inlet 112 of the valve body 110. The coolant then flows through the second passage portion 128 and the first passage portion 124 of the first valve element 120, through the bypass chamber 150, past the second valve element 140, and out of the bypass strainer valve assembly 100 through the outlet 114. As similarly discussed above, in the illustrated embodiment, the second valve element 140 is moved into the second position automatically: the force of the fluid flowing through the valve body 110 and impinging on a second side 142 of the second valve element 140, as directed by the first valve element 120, forces the valve element 140 to open the path between the bypass chamber 150 and the outlet 114 and to close the path between the filter chamber 160 and the outlet 114.

As described above with regard to the first valve element 120 and the second valve element 140, cooperating valve elements according to some embodiments can be configured to be moved independently from each other. In some embodiments, first and second valve elements can be coupled (e.g., mechanically) to be cooperatively moved between the first state (FIG. 2) and the second state (FIG. 3) of the bypass strainer valve assembly 100. Further, in some embodiments, although valve elements can be configured to be moved independently from each other, one valve element (e.g., the second valve element 140) can be configured to be automatically moved by fluid flow or other factors, upon otherwise independent movement of another valve element (e.g., the valve element 120).

In some embodiments, valve elements can be configured to be moved into third valve positions. For example, the first valve element 120 can also be configured to be placed in a third position (not shown) in which coolant fluid is prevented from passing through the bypass strainer valve assembly 100. In the third position, neither the first passage portion 124 nor the second passage portion 128 is in fluid communication with to the inlet 112. Looking at FIG. 2, this can be accomplished by rotating the first valve element 120 between about 60 degrees and about 75 degrees in a clockwise direction or between about 60 degrees and about 165 degrees in a counter-clockwise direction.

Both FIGS. 2 and 3 further show an access cap 190 removably attached to the valve body 110 at the filter chamber 160. In addition to being configured to allow access to the filter chamber 160 to allow access to the filter 162 when the filter 162 needs to be serviced or replaced, the access cap 190 can be configured to secure the filter 162 in place within the filter chamber 160. During servicing or replacement of the filter 162, the first valve element 120 is moved to the second position (FIG. 3), which directs the fluid through the bypass chamber 150 and moves the second valve element 140 to the second position (FIG. 3), which in turn blocks fluid from entering the filter chamber 160. The access cap 190 can then be removed to access the filter 162 without having to stop the flow of fluid through the bypass strainer valve assembly 100 and the liquid cooling system. The filter 162 shown in FIGS. 2 and 3 can be a cartridge filter, for example, however, other styles and forms of filters are contemplated. Likewise, in other embodiments, other types of access ports and coves can be provided for access to the interior of a valve assembly, including for access into a filter chamber.

In some implementations, devices or systems disclosed herein can be utilized, manufactured, or installed using methods embodying aspects of the invention. Correspondingly, description herein of particular features, capabilities, or intended purposes of a device or system is generally intended to inherently include disclosure of a method of using such features for the intended purposes, a method of implementing such capabilities, a method of manufacturing relevant components of such a device or system (or the device or system as a whole), and a method of installing disclosed (or otherwise known) components to support these purposes or capabilities. Similarly, unless otherwise indicated or limited, discussion herein of any method of manufacturing or using a particular device or system, including installing the device or system, is intended to inherently include disclosure, as embodiments of the invention, of the utilized features and implemented capabilities of such device or system.

Figure 4:
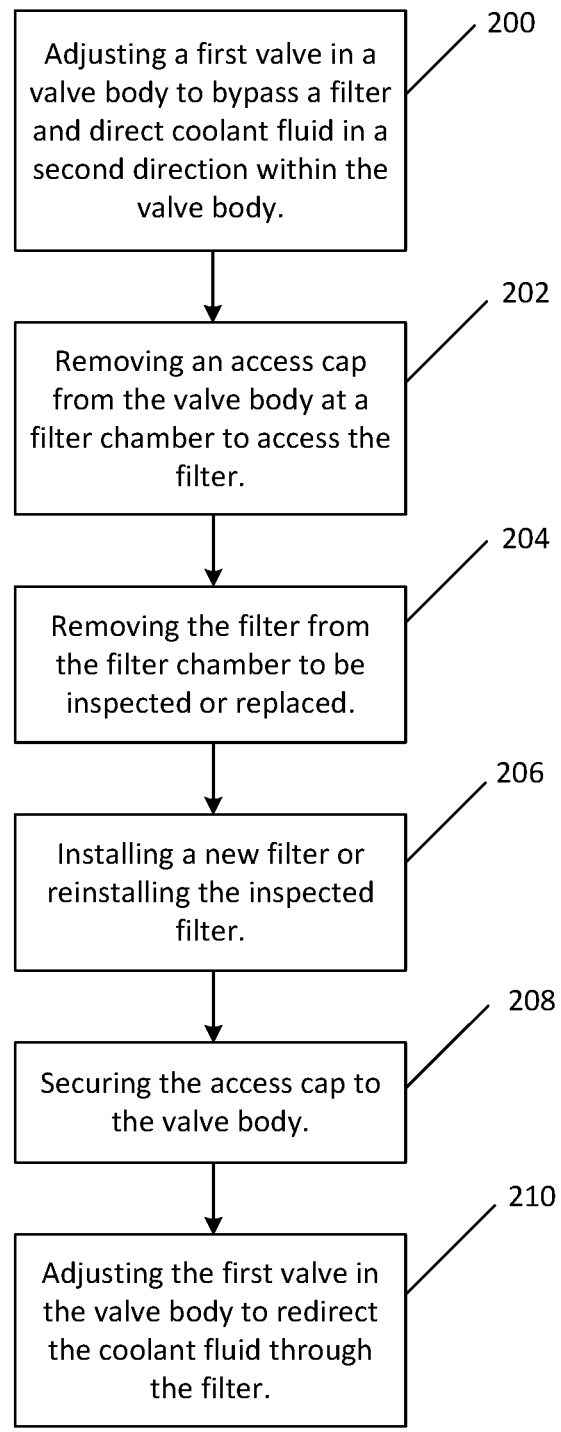
FIG. 4 is a flow chart of a method for inspecting or replacing a filter in a bypass strainer valve assembly according to an embodiment of the invention.

Correspondingly, some embodiments of the invention can include methods for servicing a filter in a high density liquid cooling system or other flow system, including as illustrated schematically in FIG. 4. With coolant (or other) fluid flowing in a first direction through a filter in a filter chamber of a bypass strainer valve assembly, the method can comprise adjusting 200 a first valve element in a valve body of the bypass strainer valve assembly to bypass the filter by directing the coolant fluid in a second direction within the valve body. This can include, for example, adjusting 200 a first valve element within the valve body from a first position to a second position, which can change the flow path of the coolant fluid through the bypass strainer valve assembly from a first path that passes through the filter to a second path that passes through a bypass chamber. A second valve element can be provided to prevent the fluid from flowing from the bypass chamber into the filter chamber, including a second valve element that is automatically moved by fluid flow into a particular position, based on the current position of the first valve element (e.g., as described in different examples above).

In some embodiments, the method can further comprise removing 202 an access cap. The access cap can take a variety of forms and can be removably and sealingly affixed to the valve body at the filter chamber. In some embodiments, an access cap may include or otherwise support a filter within the filter chamber. Removing 202 the access cap can allow access to the filter chamber and, as applicable, the filter. The filter can then be removed 204 from the filter chamber, including to be inspected, cleaned, replaced or otherwise addressed. The old (e.g., now-inspected) filter or a new filter can then be installed 206 within the filter chamber and the access cap can be secured onto the valve body 208. With appropriate sealing of the filter chamber thus obtained, the first valve element can then be adjusted 210 to redirect the coolant fluid through the filter chamber and, as applicable, the included filter. This adjustment 210 can be performed, for example, by moving the first valve element from the second position back to the first position.

Thus, embodiments of the inventions can provide for improved servicing of a filter in a piping system carrying fluid coolant in a liquid cooling system for a server rack. In some embodiments, the fluid can be directed through a bypass chamber within a valve assembly to allow access to a filter in the valve assembly without requiring the flow of fluid coolant through the liquid cooling system to be stopped. Valve assemblies according to embodiments of the invention can thus substantially reduce the time that fluid coolant is stopped from flowing through the liquid cooling system during servicing of a filter by allowing the bypassing of the filter without stopping flow of fluid through the valve assemblies. Additionally, valve assemblies according to the embodiments of the invention can reduce the amount of space required within the liquid cooling system by incorporating a bypass within the valve assembly, obviating the need for a separate bypass system external to a bypass valve.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. A bypass strainer valve assembly for controlling the flow of a fluid, the bypass strainer valve assembly comprising:
   a valve body with a valve body inlet, a valve body outlet, a filter chamber adapted to receive a removable filter, and a bypass chamber;
   a first valve element moveable within the valve body between a first position and a second position; and
   a second valve element moveable within the valve body between a first position and a second position;
   the first valve element and the second valve element being movable within the valve body between: respective first positions, in which the first valve element and the second valve element are arranged to cooperatively direct fluid from the valve body inlet, through the filter chamber, and out the valve body outlet; and respective second positions in which the first valve element and the second valve element are arranged to cooperatively direct fluid from the valve body inlet, through the bypass chamber, and out the valve body outlet;
   the second valve element being secured within the bypass strainer valve to be movable from the second position to the first position by force exerted by the flow of fluid through the valve body when the first valve element is in the first position, and movable from the first position to the second position by force exerted by the flow of fluid through the valve body when the first valve element is in the second position, and
   the second valve element preventing fluid from flowing from the first valve element into the bypass chamber when the first and second valve elements are in the first positions, and preventing fluid from flowing from the first valve element into the filter chamber when the first and second valve elements are in the second positions.

2. The bypass strainer valve assembly of claim 1, further comprising a removable filter within the filter chamber, whereby fluid can pass through the filter when the first valve element and the second valve element are in the respective first positions.

3. The bypass strainer valve assembly of claim 2, further comprising an access cap removably secured to the filter chamber that retains the filter within the filter chamber and allows access thereto when replacing or inspecting the filter.

4. The bypass strainer valve assembly of claim 1, further comprising a handle coupled to the first valve element and operable to move the first valve element between the first position and the second position.

5. The bypass strainer valve assembly of claim 1, wherein the first valve element is further movable to a third position; wherein, when the first valve element is in the third position, the first valve element prevents fluid from flowing through the valve body.

6. The bypass strainer valve assembly of claim 1, wherein the first valve element is a three-way ball valve element.

7. The bypass strainer valve of claim 1, wherein the second valve element is pivotally secured to the valve body downstream of the first valve element, to be moved between the first and second positions by fluid moving through the valve body from the valve body inlet to the valve body outlet.

8. A liquid cooling system for cooling components housed within a server rack, the liquid cooling system including a piping system and a pump for moving a liquid through the piping system, wherein the liquid cooling system further comprises:
- a bypass strainer valve assembly comprising:
  - a valve body with a valve body inlet coupled to the piping system, a valve body outlet coupled to the piping system, a filter chamber, and a bypass chamber;
  - a first valve element within the valve body and movable between a first position and a second position;
  - a second valve element within the valve body and movable between a first position and a second position; and
  - a filter removably positioned within the filter chamber;
- wherein, when the first valve element and the second valve element are in the respective first positions, a first liquid flow path is provided along a first flow direction from the valve body inlet, through the filter in the filter chamber, and out through the valve body outlet, and the second valve element blocks fluid entry from the first valve element into the bypass chamber from a second direction opposite the first flow direction; and
- wherein, when the first valve element and the second valve element are in the respective second positions, a second liquid flow path is provided along the first flow direction from the valve body inlet, through the bypass chamber, and out through the valve body outlet, and the second valve element blocks fluid entry from the first valve element into the filter chamber from the second direction.

9. The liquid cooling system of claim 8, wherein the liquid cooling system further comprises:
- an access cap removably coupled to the filter chamber; and
- wherein, when in the respective second positions, the first and second valve elements isolate the filter chamber from the second liquid flow path, so that the access cap can be removed and the filter can be accessed and removed from the filter chamber without interrupting liquid flow through the bypass strainer valve.

10. The liquid cooling system of claim 8, wherein the first valve element is manually movable between the first and second positions from outside of the valve body; and
- wherein the second valve element is movable between the first and second positions by fluid flow that is directed by the first valve element.

11. The liquid cooling system of claim 8, wherein the first valve element of the bypass strainer valve assembly is further movable to a third position; and
- wherein, when the first valve element is in the third position, liquid is prevented from flowing through either the first or second liquid flow paths.

12. The liquid cooling system of any of claim 8, wherein the first valve element is a three-way ball valve element.

13. The liquid cooling system of claim 8, wherein the position of the first valve element determines the position of the second valve element by way of the routing of fluid flow by the first valve element along the first or second liquid flow paths.

14. The liquid cooling system of any of claim 8, wherein the second valve element prevents backflow of the liquid into the bypass chamber when in the first position and prevents backflow of the liquid into the filter chamber when in the second position.

15. The liquid cooling system of claim 8, wherein the second valve element of the bypass strainer valve assembly is a flapper valve element.

16. The liquid cooling system of claim 8, wherein rotation of the first valve element is not mechanically tied to rotation of the second valve element.

17. A method for servicing a filter in a high density liquid cooling system with coolant fluid and a bypass valve assembly that includes a valve body, the method comprising:
- with a first valve element in a first position and a second valve element in a first position, such that coolant fluid flows through the valve body from a valve body inlet through a filter chamber and out of a valve body outlet, and the second valve element prevents fluid from flowing from the first valve element into a bypass chamber, moving the first valve element to a second position to bypass the filter chamber by routing the coolant fluid to flow through the valve body from the valve body inlet through the bypass chamber, move the second valve element to a second position, and flow out of the valve body outlet;
- while the flow bypasses the filter chamber with the first and second valve elements in the second positions such that the second valve element prevents fluid from flowing from the first valve element into the filter chamber, removing an access cap from the valve body to access the filter chamber from outside the valve body and thereby service a filter;
- after accessing the filter chamber, reinstalling the access cap onto the valve body; and
- after reinstalling the access cap onto the valve body, moving the first valve element back to the first position to reroute the coolant fluid through the filter chamber and thereby move the second valve element back to the first position.

18. The method of claim 17, wherein the second valve element is moved between the first or second positions only by fluid pressure from the flow through the valve body, dependent upon the positioning of the first valve element.

19. The method of claim 17, wherein the filter is a first filter and wherein servicing the filter comprises, after removing the access cap:
- removing the first filter from within the filter chamber; and
- placing a second filter within the filter chamber.

20. The liquid cooling system of claim 1, wherein rotation of the first valve element is not mechanically tied to rotation of the second valve element.

* * * * *